US009960355B2

(12) United States Patent
Northrup

(10) Patent No.: US 9,960,355 B2
(45) Date of Patent: May 1, 2018

(54) ORGANIC POLYMER SEMICONDUCTORS WITH INCREASED INTERDOMAIN CONNECTIVITY AND MOBILITY

(71) Applicant: Palo Alto Research Center Incorporated, Palo Alto, CA (US)

(72) Inventor: John E. Northrup, Palo Alto, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 233 days.

(21) Appl. No.: 14/506,139

(22) Filed: Oct. 3, 2014

(65) Prior Publication Data
US 2016/0099413 A1    Apr. 7, 2016

(51) Int. Cl.
*H01L 51/00* (2006.01)
(52) U.S. Cl.
CPC .. *H01L 51/0036* (2013.01); *C08G 2261/1412* (2013.01); *C08G 2261/22* (2013.01); *C08G 2261/222* (2013.01); *C08G 2261/3223* (2013.01); *C08G 2261/512* (2013.01); *C08L 2205/025* (2013.01)

(58) Field of Classification Search
CPC ... H01L 51/00; H01L 51/0036; H01L 51/004; H01L 51/0043
USPC .............................. 252/500; 438/99; 257/40
See application file for complete search history.

(56) References Cited

U.S. PATENT DOCUMENTS

| | | | | | |
|---|---|---|---|---|---|
| 6,869,821 | B2* | 3/2005 | Knipp | ............... | H01L 51/0525 257/40 |
| 8,318,894 | B2* | 11/2012 | Swager | ............. | C08G 61/122 528/314 |
| 8,513,359 | B2* | 8/2013 | Millward | .......... | B81C 1/00031 525/108 |
| 8,785,559 | B2* | 7/2014 | Millward | .......... | B81C 1/00031 525/104 |
| 8,821,978 | B2* | 9/2014 | Cheng | ............ | B81C 1/00031 427/258 |
| 8,828,493 | B2* | 9/2014 | Cheng | ............. | G03F 7/0392 427/258 |
| 9,356,241 | B2* | 5/2016 | Beaujuge | ......... | H01L 51/0061 |
| 2009/0092803 | A1* | 4/2009 | Bita | ............. | C08F 297/02 428/209 |
| 2010/0006023 | A1* | 1/2010 | Bour | ............ | C30B 25/02 117/89 |
| 2011/0147984 | A1* | 6/2011 | Cheng | ............ | B82Y 10/00 264/220 |
| 2011/0147985 | A1* | 6/2011 | Cheng | ............ | G03F 7/0392 264/225 |
| 2013/0250986 | A1* | 9/2013 | Wunderer | .......... | H01S 5/18361 372/36 |
| 2015/0214486 | A1* | 7/2015 | Tseng | ............. | H01L 51/0012 257/40 |

OTHER PUBLICATIONS

Ghosh, Premamoy, Polymer Science, Fundamentals of Polymer Science, Polymer Study Centre, Sep. 21, 2006, pp. 1-22.*
Northrup J.E., et al, "Electronic Structure and Mobility of Alkylated and Nonalkylated Organic Semiconductors: Role of van der Waals Interactions," Applied Physics Express 6 (2013), pp. 071601-1-071601-3.
Delongchamp D.M., et al., "Controlling the Orientation of Terraced Nanoscale 'Ribbons' of a Poly(thiophene) Semiconductor," American Chemical Society-Nano, 3:4 (2009), pp. 780-787.
Northrup J.E., "Two-dimensional deformation potential model of mobility in small molecule organic semiconductors," Applied Physics Letters 99 (2011) pp. 062111-1-062111-3.
Zhang X., et al., "Molecular origin of high field-effect mobility in an indacenodithiophene-benzothiadiazole copolymer," Nature Communications, 4:2238, (Jul. 31, 2013), 9 pages.
Street R.A., et al., "Transport in polycrystalline polymer thin-film transistors," Physical Review B 71 (2005), pp. 165202-1-165202-13.
Northrup, J.E., "Atomic and electronic structure of polymer organic semiconductors: P3HT, PQT, and PBTTT," Physical Review B 76 (2007), pp. 245202-1-245202-6.
Walukiewicz, W., "Electron Mobility in modulation-doped heterostructures," Physical Review B 30:8 (Oct. 15, 1984), pp. 4571-4582.
Jimison, L.H., "Charge-Transport Anisotropy Due to Grain Boundaries in Directionally Crystallized Thin Films of Regioregular Poly(3-hexylthiophene)," Advanced Materials 21 (2009), pp. 1568-1572.

* cited by examiner

Primary Examiner — Douglas J McGinty
(74) Attorney, Agent, or Firm — Marger Johnson

(57) ABSTRACT

An electronic device, including an organic semiconductor, the organic semiconductor having a first polymer having a first molecular weight and a first length, and a second polymer having a second molecular weight and a second length, wherein the second length is longer than the first length.

9 Claims, 6 Drawing Sheets

ORGANIC POLYMER SEMICONDUCTORS WITH INCREASED INTERDOMAIN CONNECTIVITY AND MOBILITY

BACKGROUND

Organic semiconductor materials have become important components of materials such as flexible, thin film transistors and lightweight photovoltaic cells. The transistors typically comprise a substrate, a dielectric, a source electrode, a drain electrode, and a gate electrode in addition to the semiconductor. A variety of processes can manufacture these devices such as inkjet printing and thermal evaporation. The performance of these devices improves with increases in the mobility of charge carriers in the semiconducting material. Polymeric materials such as poly(3-hexlythiophene) (P3HT) or poly(2,5-bis(3-alkylthiophen-2-yl)thieno[3,2-b]thiophene) (PBTTT) are sometimes employed as the organic semiconductor material. The term polymer is commonly employed to mean a molecule formed by linking together a sequence of identical molecular units called monomers. The length of a polymer consisting of N monomers will be N times the length of the monomer, and the molecular weight of the polymer will be N times the molecular weight of the monomer. Another type of polymer, a co-polymer, is formed by linking together a sequence of at least two types of monomers. The length, or molecular weight, of such a polymer will be the sum of the lengths, or molecular weights, of the monomers. An alternating co-polymer could be specified as A-D-A-D . . . A-D where A and D represent distinct monomers. Indacenodithiophene-co-benzothiadiazole is an example of a co-polymer. Polymeric materials are advantageous because they can be incorporated into a device inexpensively by solution processing, and can achieve mobility of 0.1 to 1 cm2/Vs.

One approach to increasing the mobility of the charge carriers, holes and electrons, in organic semiconductor materials enhances the electronic connectivity between ordered domains.

DETAILED DESCRIPTION OF THE EMBODIMENTS

Figure 1:
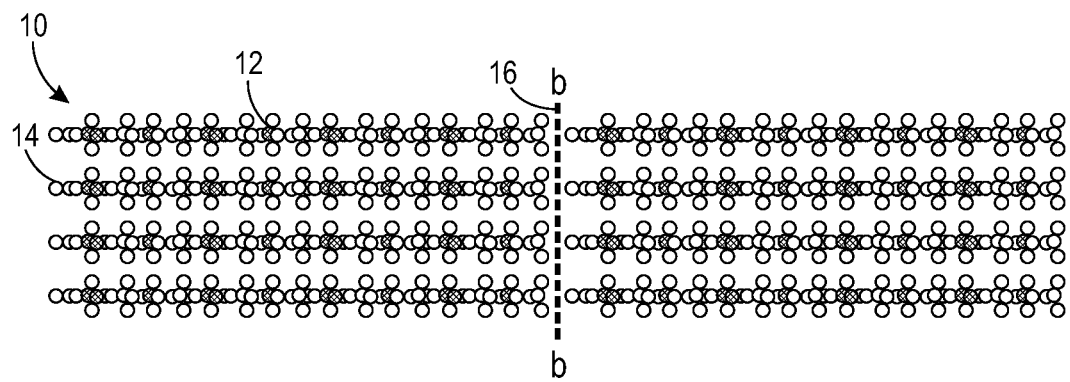
FIG. 1 shows an embodiment of a region of a material in which all the polymers have the same length.

FIG. 1 shows a region 10 of a material in which all the polymers have the same length. In FIG. 1 each polymer consists of 8 monomers, and each monomer consists of one thiophene ring and one alkyl side chain. The molecular forces between the polymers tend to cause each polymer to align with its neighbors. Because the polymers are finite in length this alignment can lead to structural breaks at boundaries separating one ordered region from another. This is consistent with experimental observations as discussed in Jimision, et al. "*Charge-Transport Anisotropy Due to Grain Boundaries in Directionally Crystallized Thin Films of Regioregular Poly*(3-*hexylthiophene,*" *Advanced Materials,* 21 (16) 1568-1572 (2009) This polymer alignment may give rise to a grain boundary. Grain boundaries impede transport of carriers. In the diagram of FIG. 1, the grain boundary is shown by line b-b.

Figure 2:
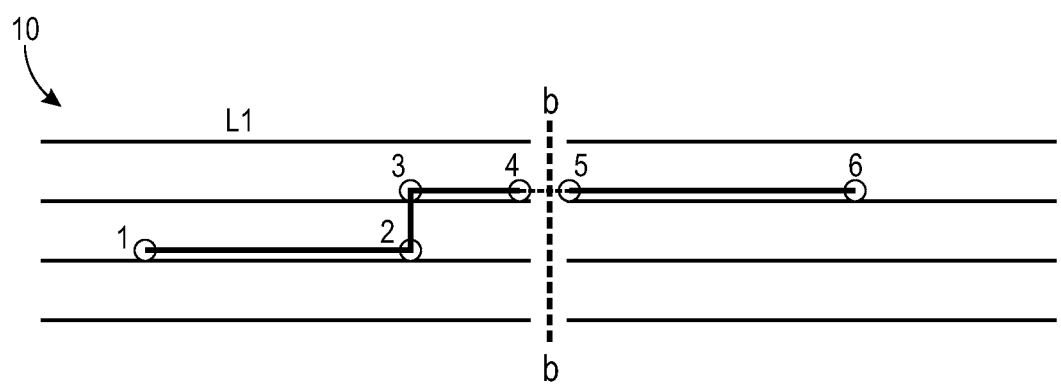
FIG. 2 shows a connection diagram for a region of a material in which all the polymers have the same length.

FIG. 2 shows a connection diagram for a region of a material in which all the polymers have the same length, in this example the length is L1. The carrier, whether a hole or an electron, has a fast transport path from point 1 to point 2. Transport from 4 to 5 is impeded because of the grain boundary along b-b. Transport from 2 to 3 is not as fast as the transport along the path from 1 to 2, but is faster than the path between 4 and 5. The transport along path 5 and 6 on the other side of the grain boundary is similar to transport along the path from 1 to 2.

Figure 3:
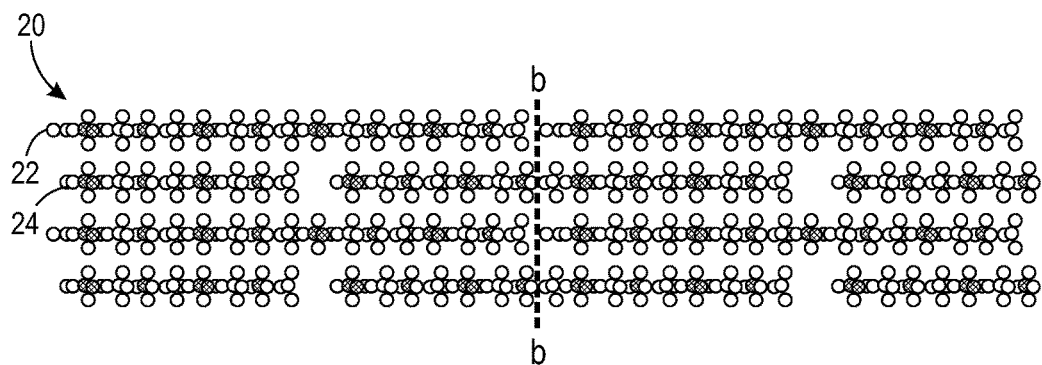
FIG. 3 shows an embodiment of a region of a material in which all the polymers have the same length and are staggered.

FIG. 3 shows a second structure in which the monomers are not aligned. Referring back to FIG. 1, the material consists of a series of weakly connected domains separated by boundaries perpendicular to the x-axis. In FIG. 3 the region 20 of the material has every other polymer such as 22 shifted along the x-axis relative to the polymer 24. The shifting increases the electronic interconnectivity.

Application of a simple model can estimate the ratio of mobilities of the structures FIG. 1 and FIG. 3. A two dimensional acoustic deformation potential model shows that elimination of the grain boundary leads to an increase in the mobility. In the model, the mobility is determined by scattering of charge carriers by thermally driven fluctuations in the potential. While this is an idealization, it provides a means to make an estimate of the mobility within an organic semiconducting material. The mobility µ is given by:

$$\mu = \frac{e\bar{h}^3 B L_{\it{eff}}}{\mathcal{E}_{ac}^2 (k_B T)(m_c m_d)}.$$

In this expression $m_c$ is the effective mass along the direction of transport and $m_d$ is the density of states mass, which is equal to $(m_x m_y)^{1/2}$. $\mathcal{E}_{ac}$ is the acoustic deformation potential and B is the bulk modulus. $L_{\it{eff}}$ is the effective thickness of the layer in which the transport occurs.

From electronic structure calculations one may determine the effective masses for the structure of FIG. 1 and the structure of FIG. 3. In order to provide a specific example, the following discussion uses poly(3-ethylthiophene)polymers containing 8 thiophene rings. For the structure of FIG. 3, the effective masses along the x and y directions are $m_x$=0.36 m and $m_y$=2.3 m. For the structure of FIG. 1, the effective masses along the x and y directions are 2.9 m and 1.7 m. The effective mass values are given as multiples of the free electron m of the electron. The reduction of the effective mass from 2.9 m to 0.36 m by the increased interconnectivity present in the structure of FIG. 3. The equation above allows one to estimate the ratio of mobilities between the structures of FIG. 1 and FIG. 3.

Assuming that the deformation potential, bulk modulus, and $L_{\it{eff}}$ are not affected by the polymer alignment, the mobility ratio can be obtained from the effective mass values. In the below equation, the structure of FIG. 3 is referred to as II, and the structure of FIG. 1 is referred to as I.

$$\mu_x(II)/\mu_x(I)=(m_x(I)m_y(I))^{1/2}m_x(I)/(m_x(II)m_y(II))^{1/2}m_x(II)=20$$

$$\mu_y(II)/\mu_y(I)=(m_x(I)m_y(I))^{1/2}m_y(I)/(m_x(II)m_y(II))^{1/2}m_x(II)=1.8.$$

This demonstrates that there is a tremendous enhancement of mobility along the x direction. The enhancement is 20 for transport along the x direction and 1.8 for transport along the y direction. Therefore employing strategies to increase the interdomain connectivity will improve the mobility.

Figure 4:
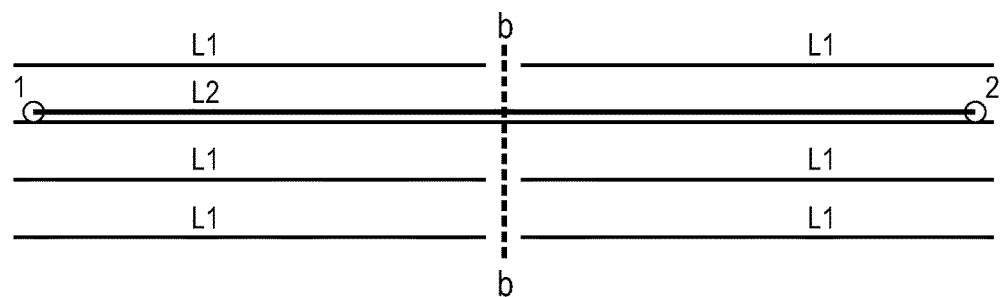
FIG. 4 shows a connection diagram for an embodiment of a region of a material having polymers of different lengths.

One strategy would involve employing a mixture of two different polymers where one of the polymers has a longer length than the other. In one example, a mixture of a fraction (1-f) of a first polymer having a first length L1 and a fraction f of a second polymer having a second length L2. FIG. 4 shows a connection diagram for such a mixture, in which the length L2 is twice that of L1. The transport path between points 1 and 2 is very fast across the grain boundary.

Figure 5:
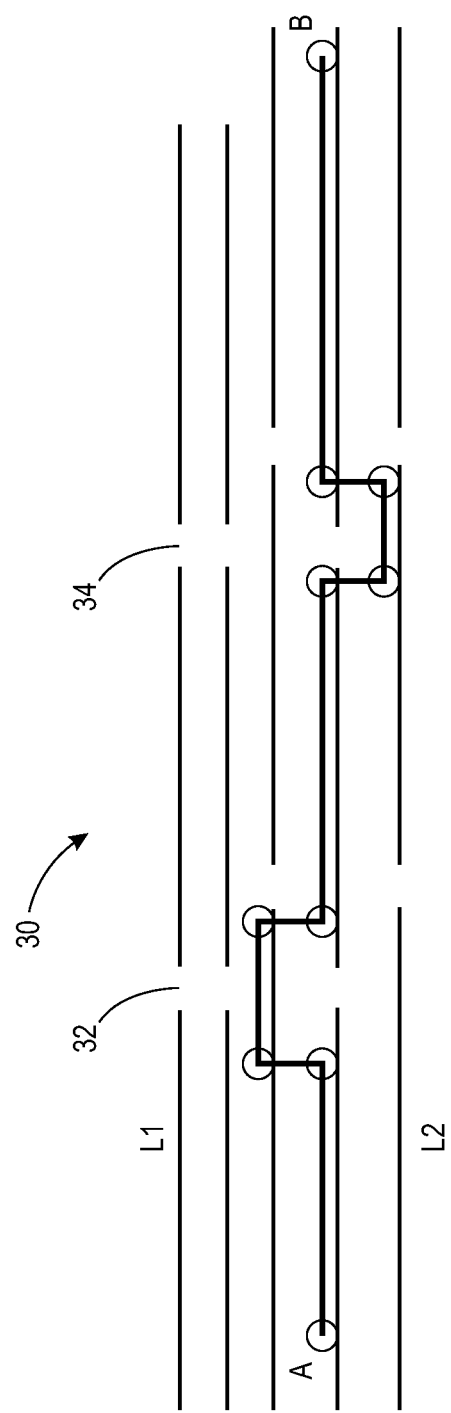
FIG. 5 shows a connection diagram for an embodiment of a region of a material having polymers of different lengths.

FIG. 5 shows a connection diagram for a region of a material having a mix of P1 and P2. The connection diagram for an example mix of a fraction f=0.2 (20%) of a polymer P2, and a fraction f=0.8 of a polymer P1. An example of such a mix would involve P3HT with 16 thiophene rings (P1) and 20 thiophene (P2). The path between points A and B has relatively fast transport. Previously, the materials would have had grain boundaries 32 and 34 across which transport will have been impeded. Now, the carriers can travel across the region where there previously would have been a boundary, and then using the longer polymer P2 to transport across the entire length of the region of the material.

Figure 6:
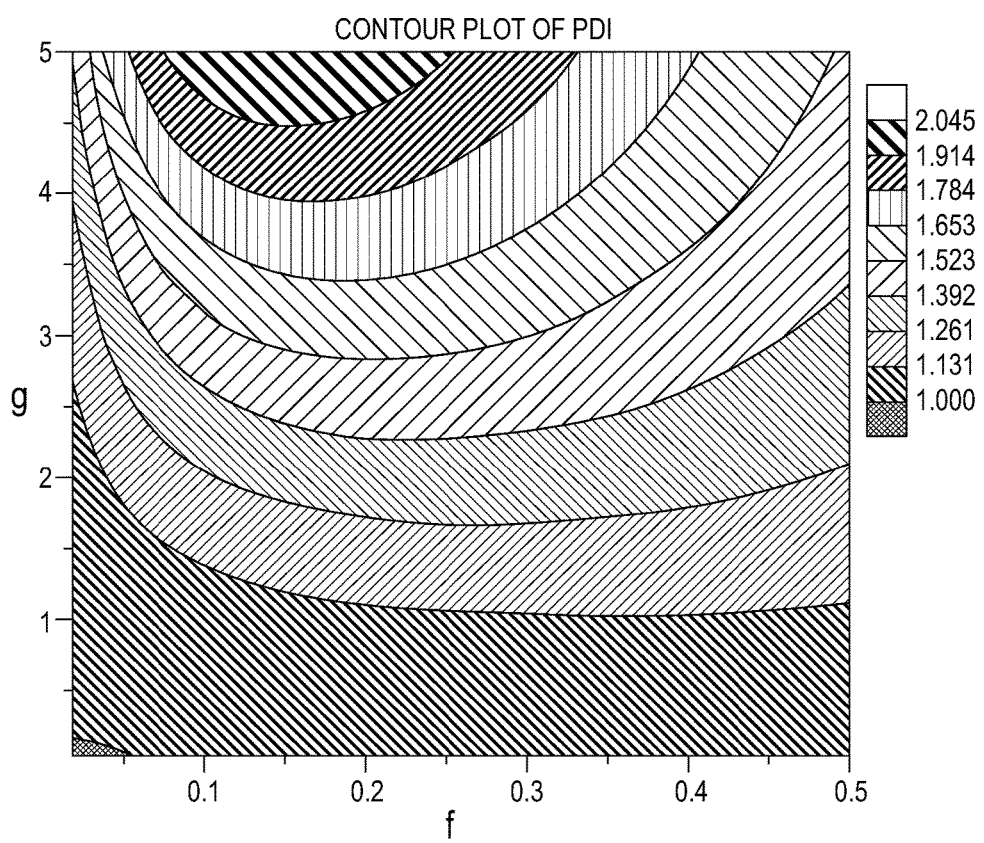
FIG. 6 shows a contour plot of polydispersity index for a mixture of two polymers.

One can characterize a variation in molecular weight of an aggregation of polymers using a polydispersity index (PDI). Many polymer aggregates have a PDI of 2 or greater. The PDI is equal to $M_W/M_N$ where $M_W=(1/M_T)\Sigma M_i^2$ and $M_N=(1/N)\Sigma M_i$. $M_T$ is the total weight of the aggregation, N is the number of polymers in the aggregation, and the sum $\Sigma$ is over all polymers in the aggregation. If a mixture consists of a fraction f of P2 and (1-f) of P1, where the polymer weight of P2 is (1+g) times that of P1, then PDI=(1+fg(2+g))/(1+fg)$^2$. For the case of f=0.2 and g=0.2, the PDI=1.06, and for the case of f=0.5 and g=1, PDI is 1.11. FIG. 6 shows a contour plot of PDI as a function of f and g. The materials employed in the embodiment generally have a PDI less than 2, and may be less than 1.2.

Figure 7:
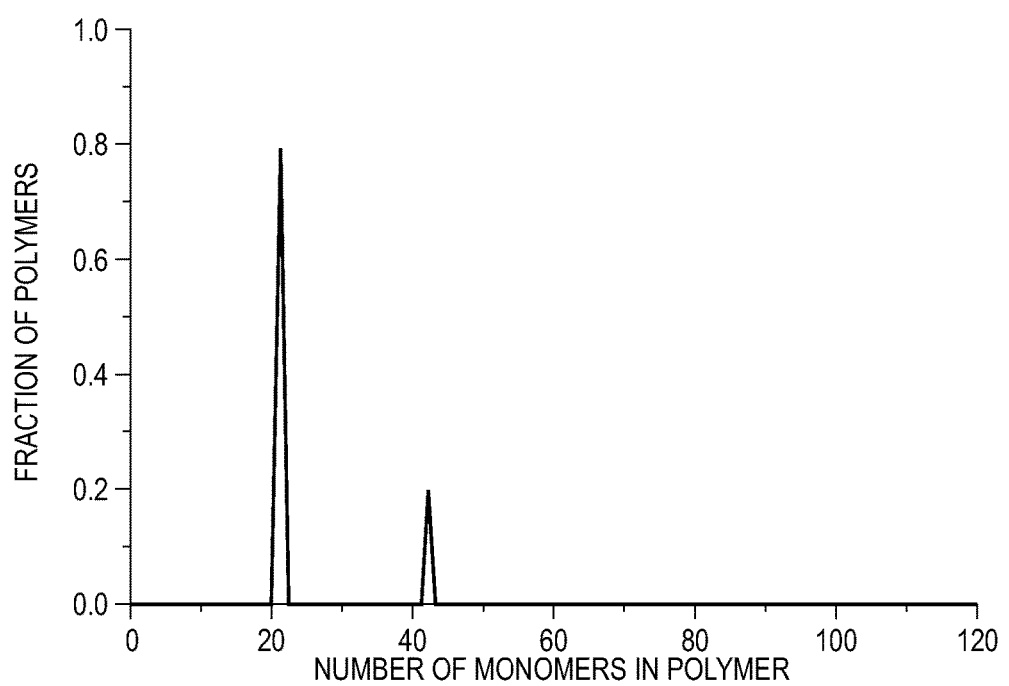
FIG. 7 shows a plot of the distribution of monomer numbers in a bi-disperse mixture.

A mixture of polymers of primarily two different lengths, and two molecular weights, may be referred to as a bi-disperse mixture. An example of the distribution of polymer lengths in a bi-disperse mixture is shown in FIG. 7. FIG. 7 shows the fraction f of polymers present in the mixture as a function of the number of monomers N in each polymer. The distribution shown there is sharply peaked at two different monomer numbers N1 and N2. The widths, W1 and W2, of the two peaks are optimally less than or equal to 1 monomer, but in practice the widths may be greater than 1 monomer.

In the example shown in FIG. 7 there is a fraction f1=0.8 of polymers composed of N1=20 monomers and a fraction f2=0.2 of polymers composed of 40 monomers. The longer monomers will provide connections between ordered domains consisting primarily of the shorter polymers. The presence of a fraction f2 of longer polymers enhances the mobility of the material. The widths of the peaks are much less than the separation (N2−N1) between the peaks.

Figure 8:
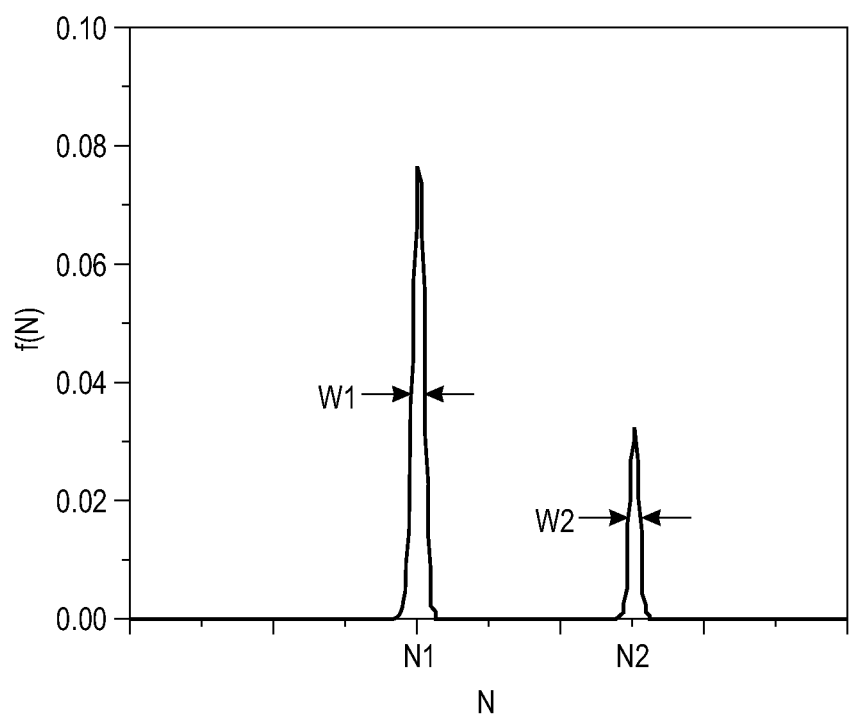
FIG. 8 shows a plot of another embodiment of a bi-disperse mixture.

FIG. 8 shows another example of a bi-disperse mixture. The function f(N) is the fraction of polymers in the material composed of N monomers. This function f(N) is peaked around N1 and N2. The full-width half-maximum width of the peaks, W1 and W2, may be larger than a few monomers, but each width is required to be less than N2−N1. A bi-disperse mixture of two polymers having widths W1 and W2 that are much less than (N2−N1) is expected to exhibit good interconnectivity of ordered domains and superior mobility.

The embodiments disclosed here provide polymer materials with higher transport mobility. The polymers discussed here may be employed in organic semiconductors and allow for more efficient functioning devices.

It will be appreciated that several of the above-disclosed and other features and functions, or alternatives thereof, may be desirably combined into many other different systems or applications. Also that various presently unforeseen or unanticipated alternatives, modifications, variations, or improvements therein may be subsequently made by those skilled in the art which are also intended to be encompassed by the following claims.

What is claimed is:

1. An electronic device, comprising an organic semiconductor layer being a mixture of two polymers, containing ordered domains separated by less ordered boundary regions, the organic semiconductor comprising:
   a first conducting polymer consisting of a number N1 of a first monomer, the first conducting polymer having a first molecular weight equal to N1 times a molecular weight of the first monomer and a first length;
   the first polymer forming ordered domains of higher electrical conductivity separated by domain boundary regions of lower conductivity; and
   a second conducting polymer added to the first polymer to form a conducting link between at least two ordered domains formed of the first polymer and to increase the overall conductivity of the film, the second polymer consisting of a number N2 of a second monomer different from the first monomer, the second polymer having a second molecular weight equal to N2 times a molecular weight of the second monomer and a second length, wherein the second length is selected to be longer than the first length and N2 is greater than N1.

2. The electronic device of claim 1, wherein the polydispersity index is less than 1.5.

3. The electronic device of claim 1, wherein the organic semiconductor comprises a p-type semiconductor.

4. The electronic device of claim 1, wherein the organic semiconductor comprises an n-type semiconductor.

5. The electronic device of claim 1, wherein the polydispersity index is less than 1.2.

6. An electronic device, comprising:
   an organic semiconductor formed from a mixture of two different conducting polymers;
   the mixture of conducting polymers having a distribution of monomer numbers; the distribution exhibiting one peak centered at N1 first monomers and a second peak centered at N2 second monomers different from the first monomer, wherein N2>N1, and wherein the width of the peak at N1 is W1 and the width of the peak at N2 is W2, the widths W1 and W2 being such that W1 and W2 are each less than the distance between the peaks centered at N2 and N1, according to FIG. 8.

7. The device of claim 6, wherein the polymers comprise a p-type semiconductor.

8. The device of claim 6, wherein the polymers comprise an n-type semiconductor.

9. The device of claim 6, wherein the longer polymers link at least two ordered domains.

\* \* \* \* \*